(12) United States Patent
Cayrefourcq et al.

(10) Patent No.: US 7,601,611 B2
(45) Date of Patent: Oct. 13, 2009

(54) METHOD OF FABRICATING A SEMICONDUCTOR HETERO-STRUCTURE

(75) Inventors: Ian Cayrefourcq, St. Nazaire les Eymes (FR); Fabrice Letertre, Grenoble (FR); Bruno Ghyselen, Seyssinet-Pariset (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 479 days.

(21) Appl. No.: 11/147,575

(22) Filed: Jun. 7, 2005

(65) Prior Publication Data
US 2006/0216907 A1 Sep. 28, 2006

(30) Foreign Application Priority Data
Mar. 24, 2005 (FR) .................................. 05 02923

(51) Int. Cl.
*H01L 21/30* (2006.01)
(52) U.S. Cl. ................ 438/455; 438/458; 257/E21.567
(58) Field of Classification Search .................. 438/455, 438/458
See application file for complete search history.

(56) References Cited
U.S. PATENT DOCUMENTS

| | | | |
|---|---|---|---|
| 5,266,824 A | 11/1993 | Abe et al. | 257/347 |
| 6,403,450 B1 | 6/2002 | Maleville et al. | 438/471 |
| 6,964,914 B2 * | 11/2005 | Ghyselen et al. | 438/458 |
| 2004/0023468 A1 | 2/2004 | Ghyselen et al. | 438/455 |
| 2004/0241960 A1 | 12/2004 | Maurice et al. | 438/458 |
| 2005/0130393 A1 | 6/2005 | Blondeau et al. | 438/479 |

FOREIGN PATENT DOCUMENTS

| | | |
|---|---|---|
| EP | 0 504 714 A2 | 9/1992 |
| EP | 1 482 548 A1 | 12/2004 |
| EP | 1 542 275 A1 | 6/2005 |

* cited by examiner

*Primary Examiner*—Jack Chen
(74) *Attorney, Agent, or Firm*—Winston & Strawn LLP

(57) ABSTRACT

A method of fabricating a structure that includes at least one semiconductor material for applications in microelectronics, optoelectronics or optics. The method includes transferring, onto a support made of a first material, a thin monocrystalline layer made of a second material that differs from the first material, and performing a predetermined heat treatment carrying out at least one strengthening step on a bonding interface between the thin layer and the support. The thickness of the thin layer is selected as a function of the difference between the coefficients of thermal expansion of the first and second materials and as a function of parameters of predetermined heat treatment, such that the stresses exerted by the heat treatment on the assembly of the support and the transferred thin layer leaves the assembly intact. The method further includes depositing an additional thickness of the second material in the monocrystalline state on the thin layer to thicken it. The method is useful for fabrication of heterosubstrates with a relatively thick useful layer.

16 Claims, 1 Drawing Sheet

METHOD OF FABRICATING A SEMICONDUCTOR HETERO-STRUCTURE

BACKGROUND

The present invention relates in general to the fabrication of semiconductor materials, more particularly semiconductor hetero-substrates for use in microelectronics, optoelectronics, optics, or photonics.

More precisely, the invention relates to a novel method of fabricating a semiconductor hetero-substrate composed at least of a support and one or more thin layer(s), in which the materials employed and their thermal properties may differ.

Methods of this type are already known in general. For example, it is known to produce hetero-substrates employing bonding techniques, in particular molecular bonding. Non-limiting examples include the methods known as the BESOI®, ELTRAN® and SMART-CUT® methods, all of which employ a bonding step. It will be recalled in this regard that in the context of fabricating hetero-substrates, these methods comprise at least the following steps:

a) bonding by putting into contact two generally-massive substrates made of materials that are in general dissimilar, with a useful layer that rests on a support substrate, the whole forming a hetero-structure;

b) strengthening the bonding interface of the two substrates by carrying out a high temperature heat treatment to reduce the fragility of the interface, thereby avoiding or at least limiting problems of delamination or degradation of the mechanical and/or electrical properties of the useful layer; and c) reducing the thickness of the useful layer resting on the support substrate to constitute a thin layer on such substrate.

Such steps may be carried out with different variations, such as sacrificial oxidation in step c), or in a different order, in particular by interchanging steps b) and c).

Further, certain of those steps may be combined to optimize the overall method (i.e., the cumulative duration of treatments, cumulative duration associated with manipulation, etc). As an example, a stabilization heat treatment of the bonding interface (step b)) may advantageously be combined with a thinning step (step c)) (see U.S. Pat. No. 6,403,450).

In the context of the production of hetero-substrates with materials having different properties, for example different coefficients of thermal expansion, the heat treatments carried out during fabrication of a composite substrate for strengthening of the interface, thinning, or the like, typically induce large mechanical stresses. Such stresses may result in weakening, followed in some cases by cracking or even fracture of one or both of the treated substrates. Such stresses may also result in irreparable plastic deformation of the treated substrate or substrates. In particular, dislocations and/or slip planes and/or other crystalline defects may appear.

It is also known that the temperatures at which such problems appear typically depend on:

- the mechanical energy stored by the composite structure during the heat treatment which is carried out;
- the difference between the coefficients of thermal expansion of the component materials of the composite structure; and
- the thicknesses of the substrates employed.

In the context of fabricating hetero-substrates by a SMART-CUT® method, such problems may constitute severe limitations. More particularly, the maximum possible temperatures are reduced, so that heat treatments become difficult to use because of lack of efficiency.

As a non-limiting example, a strengthening heat treatment of an interface at about 1050° C.-1000° C. will be difficult to carry out in the case of a hetero-structure having a useful layer that is 500 Å thick, the temperatures generally employed in that type of treatment being too high as regards the problems mentioned above.

Further, solutions are known which may improve the reinforcement of the bonding interface of a hetero-substrate without supplying too much energy. A first proposal, known as "plasma bonding", consists in applying certain treatments to the surfaces to be bonded, to increase the bonding energy for a given strengthening heat treatment. In that way, thermal stresses to which the substrates are subjected are released, while maintaining sufficient strengthening and encapsulating of the interface in the composite structure. However, that proposition requires specific equipment, limiting its economic attraction.

A second known solution consists in carrying out eutectic bonding: a metallic layer ($Au_2Si_3$) is interposed between the two substrates to be bonded to facilitate their bonding by heat treatment, so that the temperatures can remain relatively low. Thus, that solution also has the advantage of being able to release thermal stresses in a treatment for strengthening the interface in a hetero-substrate. However, the presence of the metallic layer at the interface limits the maximum temperatures permitted during subsequent steps in the fabrication method; temperatures which are too high could lead to melting of that layer. Further, an additional step is needed for interposing the metallic layer.

Thus, there is a need for better solutions to these problems, and these are now provided by the present invention.

SUMMARY OF THE INVENTION

The invention relates to a method of fabricating a semiconductor hetero-structure which comprises transferring, onto a support of a first material, a thin monocrystalline layer of a second material that differs from the first material to form an assembly that has a bonding interface between the layer and the support; performing a predetermined heat treatment for strengthening the bonding interface; and depositing an additional thickness of the second material in the monocrystalline state onto the transferred thin layer to form the structure. Advantageously, the thin layer has a thickness selected as a function of the difference between coefficients of thermal expansion of the first and second materials and as a function of heat treatment parameters so that the stresses exerted by the heat treatment on the assembly leaves the assembly intact.

The method further includes depositing an additional thickness of the second material in the monocrystalline state on the thin layer to thicken it. The method is useful for fabrication of hetero-substrates with a relatively thick useful layer.

BRIEF DESCRIPTION OF THE DRAWING

The benefits and advantages of the present invention will become clear from a review of the following detailed description of preferred implementations thereof, given by way of non-limiting example and made with reference to the accompanying drawing, in which.

It should be noted that the dimensions shown in the figures, in particular the relative thicknesses, have been selected with a view to clarity and are not to scale.

DETAILED DESCRIPTION OF THE PREFERRED EMBODIMENTS

The invention relates to a method of fabricating a hetero-structure comprising at least one semiconductor material for applications in microelectronics, optoelectronics, or optics. This method comprises transferring, onto a support made of a first material, a thin monocrystalline layer made of a second material that differs from the first material to form an assembly that has a bonding interface between the layer and the support. The method further includes performing a predetermined heat treatment for carrying out at least one strengthening step on the bonding interface, with the thickness of the thin layer selected as a function of the difference between the coefficients of thermal expansion of the first and second materials and as a function of the parameters of the predetermined heat treatment, so that the stresses exerted by the heat treatment on the assembly of the support and the transferred thin layer leaves the assembly intact. Finally, the method includes an additional step of depositing an additional thickness of the second material in the monocrystalline state onto the thin layer to thicken it.

Certain preferred but non-limiting aspects of the method of the invention follow.

The thickness of the transferred thin layer is typically in the range of about 100 Å to about 300 Å, preferably in the range of 150 Å to 250 Å, while the thickness of the deposit produced on the transferred thin layer is in the range of about 1000 Å to about 5000 Å.

The step of transferring the thin layer of the second material comprises sub-steps that include creating a zone of weakness defining the thin layer to be transferred in a donor wafer by atomic species implantation, then bringing the donor wafer into contact with the support for bonding thereto and applying stresses to cause detachment of the thin layer from the remainder of the donor wafer following contact and bonding. This is the well known SMART-CUT® method.

The method can also include an additional step of preparing the free surface of the thin layer following detachment, in order to produce the deposit. This facilitates a deposition step that is preferably carried out by epitaxy.

As for suitable materials of the structure, the first material is preferably an insulator, such as quartz, while the second material is a semiconductor such as silicon. Alternatively, the first material can be a semiconductor, such as silicon, while the second material is a different semiconductor material, such as germanium.

The heat treatment that is preferably used is suitable for producing, in the transferred thin layer, a level of defects associated with the difference between the coefficients of thermal expansion of the first and second materials that is acceptable.

Figure 1A:
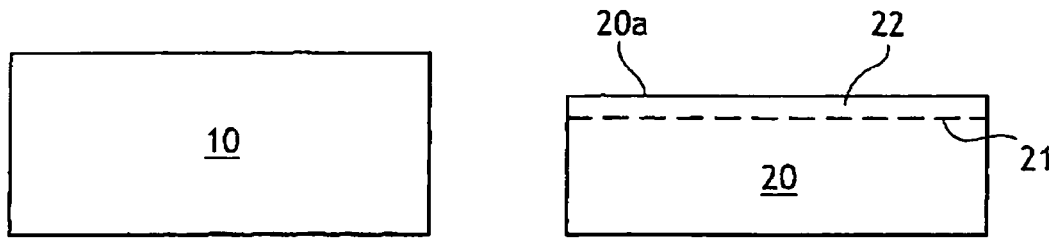
FIGS. 1A and 1D are diagrams showing the main steps of a preferred method of the invention.
Figure 1B:
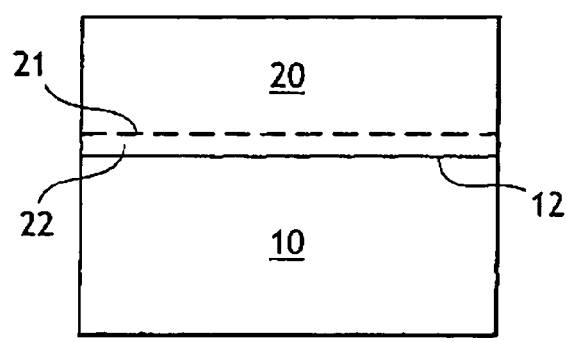

Firstly, FIG. 1A shows a support 10 and a donor wafer 20 in which a zone of weakness 21 has been produced, for example by implanting ions through one of the faces 20a of the wafer, to define a zone 22 of the wafer 20 that is to be transferred onto the support 10.

In step 1B, the support 10 and the wafer 20 are assembled and bonded together by molecular bonding, a bonding interface layer (not shown) such as an oxide or a nitride optionally being formed on the support and/or on the wafer. The bonding interface is designated by reference numeral 12.

Figure 1C:
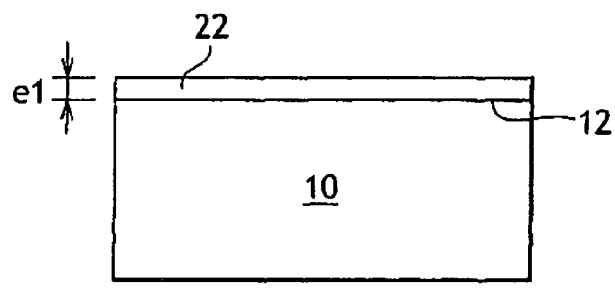

The assembly then undergoes heat treatment in one or more steps to result in detachment of the zone 22 from the remainder of the wafer 20 at the zone of weakness, and to reinforce the bonding interface between the support 10 and the thin layer now formed by the detached zone 22 as indicated above. The structure formed is shown in FIG. 1C.

The above steps correspond overall to the well established SMART-CUT® method.

The present invention envisages situations in which the material of the support 10 and the material of the thin layer 22 have coefficients of thermal expansion which are sufficiently different from each other for the above-mentioned heat treatments not to be usable without some sort of deterioration occurring in the structure composed of the support 10 and the thin layer 22, plus any bonding interface layers.

In accordance with the invention, a small value is selected for the thickness e1 of the transferred layer 22 so that the above-mentioned heat treatments leave the structure substantially unaffected; in other words, the thickness of the layer 22 is selected to be small enough not to cause rupture phenomena or indeed any undesirable plastic deformation phenomena associated, for example, with dislocations, atomic slip planes, cracks, etc. in the layer 22.

The free surface of the layer 22 is then prepared to receive a deposit of the same material. This preparation may include chemical-mechanical polishing, sacrificial oxidation, rapid thermal annealing (RTA), or oven annealing, etc., the objective in this instance being to reduce the surface roughness to a sufficiently low value.

Figure 1D:
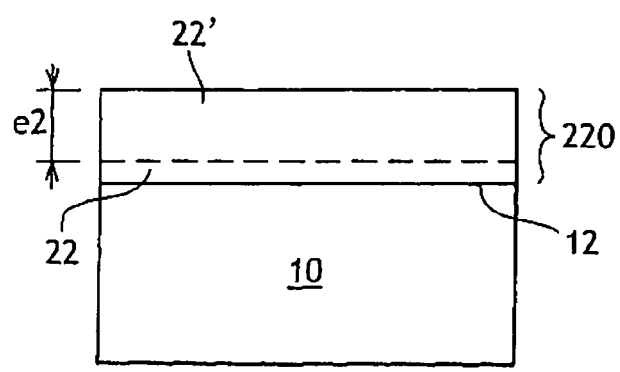

The next step of the method, shown in FIG. 1D, consists in using the prepared layer 22 as a seed layer for epitaxially depositing a layer 22' of the same material to a thickness e2, in order to increase the thickness of the overall layer 220 (useful layer) of the material constituting layers 22 and 22' up to the desired value. Epitaxy can produce a very good crystalline quality.

It will be observed here that the choice of the thickness e1 for the transferred layer 22 may be such that there exists a certain density of dislocations or slip planes in the intermediate hetero-structure shown in FIG. 1C, and in particular in the transferred layer 22. Said defects, after epitaxial growth of the layer 22', are buried in the depth of the useful layer 220 and do not penetrate through it.

It will also be observed that the stage of thickening the layer 22' by epitaxial deposition, makes it possible for a much greater final thicknesses to be transferred than was previously possible with a SMART-CUT® type technique, which suffers from the inherent limitation of the depth to which implantation is possible.

EXAMPLES

The following examples further illustrate preferred embodiments of the invention.

Example 1

The first example seeks to produce a structure composed of a quartz support, for example 1.2 mm (millimeters) thick, on which there is a monocrystalline silicon layer with a thickness which may reach 500 Å to 2000 Å for applications in microelectronics, or even more for other applications such as charge coupled devices (CCDs).

Experimentation shows that the critical temperature beyond which excessive plastic deformation (dislocations, slip planes, etc.) occurs in a structure composed of a thin layer of Si transferred using the SMART-CUT® method onto a quartz support depends on the thickness of the transferred layer in the following manner:

| Thickness of layer 22 | Critical temperature |
|---|---|
| 2000 Å | 750° C. |
| 500 Å | 950° C. |
| 200 Å | 1100° C. |

In the present example, a 200 Å thick layer of monocrystalline silicon 22 is transferred onto a support 10 of quartz, the transfer involving strengthening of the bonding interface by heat treatment at 1050° C. for a period of about two hours. Because of the limited thickness of the layer 22, the heat treatment causes no prejudicial deterioration (cracking or rupture) of the structure. The free surface of the thin layer 22 is then prepared for epitaxial deposition of the additional silicon to produce the monocrystalline useful layer of the desired thickness. The epitaxy to make the layer 22', also of monocrystalline silicon, is carried out to a thickness which can vary widely, depending on the application.

Thus, for applications in microelectronics, the thickness of the deposit is about 800 Å to about 1800 Å, for example, resulting in a useful layer having thickness of about 100 Å to about 2000 Å.

For CCD applications, the desired overall thickness is typically 5 μm (micrometers) to 10 μm.

Example 2

A semiconductor on insulator structure is to be produced comprising a support of silicon (monocrystalline or polycrystalline) and a thick useful layer of monocrystalline germanium, for example for applications in photovoltaic components.

The heat treatments required to detach the thin layer 22 of germanium are determined with respect to its donor wafer and to the strengthening of the bonding interface with the silicon support 10.

Typically, these treatments comprise a detachment stage at a temperature of about 300° C. to about 400° C. over a period of about a few minutes to about two hours, then a stage of strengthening the bonding interface at a temperature of about 500° C. to about 800° C. for a period of about one hour.

Subsequently, it is found that the small thickness of the thin layer 22, no more than about 200 Å, allows heat treatments to be applied to the structure without deteriorating said thin layer.

Subsequently, following a treatment preparatory to epitaxy such as chemical-mechanical polishing, a deposit of monocrystalline germanium 22' is produced on the thin layer 22 so as to continue the layer 22 in terms of its crystalline structure, and thus make it thicker. In the present example, said deposition is carried out at a temperature of about 700° C. over a thickness of 4800 Å, to form a useful layer of monocrystalline germanium with a total thickness of 5000 Å or more (up to 3 μm).

Clearly, the present invention is not limited to the implementations described; the skilled person is at liberty to make numerous variations. It is of application whenever a heterostructure is to be produced comprising at least one semiconductor material and in which a transferred layer is to have a thickness that is greater than that permitted by the essential starting parameters, namely the heat treatments to be carried out and the difference between the coefficients of thermal expansion of the two materials. Particular structures that can be cited are InP on Si and GaAs on Si.

It should also be noted that the transferred thin layer may be strained, in tension or in compression, the additional thickness of material supplied by deposition preserving that strain. This can produce thick strained layers, the strains being guaranteed over thicknesses of several tens of nanometers, or even up to several hundred nanometers depending on the level of strain which is to be preserved.

What is claimed is:

1. A method of fabricating a semiconductor hetero-structure which comprises transferring, onto a support of a first material, a thin monocrystalline layer of a second material that differs from the first material to form an assembly that has a bonding interface between the layer and the support, with the thin layer having a thickness selected as a function of the difference between coefficients of thermal expansion of the first and second materials and as a function of heat treatment parameters so that the stresses exerted by the heat treatment on the assembly leaves the assembly intact, with the thickness being sufficiently thin to not cause rupture phenomenon or undesirable plastic deformation phenomenon associated with dislocations, atomic slip planes, or cracks; performing a predetermined heat treatment for strengthening the bonding interface; and forming an additional thickness of the second material in the monocrystalline state onto the transferred thin layer to form the structure, wherein the additional thickness formed is less than 10 μm.

2. The method of claim 1, wherein the thickness of the transferred thin layer is about 100 Å to about 300 Å.

3. The method of claim 1 wherein the thin layer is transferred by creating a zone of weakness that defines the thin layer to be transferred in a donor wafer; bring the donor wafer into contact with the support, and applying stress to cause detachment of the thin layer from the donor wafer.

4. The method of claim 3 wherein the zone of weakness is obtained by implanting atomic species into the donor wafer.

5. The method of claim 3, which further comprises preparing a free surface of the thin layer following detachment to reduce roughness in order to enable the additional thickness of the second material to be formed thereon.

6. The method of claim 1, wherein the additional thickness of the second material is deposited by epitaxy.

7. The method of claim 1, wherein the first material is an insulator.

8. The method of claim 7, wherein the first material is quartz.

9. The method of claim 8, wherein the second material is silicon.

10. The method of claim 1, wherein the first material is a semi-conductor.

11. The method of claim 10, wherein the first material is silicon.

12. The method of claim 11, wherein the second material is germanium.

13. The method of claim 1, wherein the heat treatment is suitable for producing, in the transferred thin layer, an acceptable level of defects associated with the difference between the coefficients of thermal expansion of the first and second materials.

14. The method of claim 7, wherein the second material is a semi-conductor.

15. The method of claim 1, wherein the second material is germanium and the first material is a different semiconductor material.

16. A method of fabricating a semiconductor hetero-structure which comprises transferring, onto a support of a first material, a thin monocrystalline layer of a second material that differs from the first material to form an assembly that has a bonding interface between the layer and the support, with the thin layer having a thickness selected as a function of the difference between coefficients of thermal expansion of the first and second materials and as a function of heat treatment parameters so that the stresses exerted by the heat treatment on the assembly leaves the assembly intact; performing a predetermined heat treatment for strengthening the bonding interface; and forming an additional thickness of the second material in the monocrystalline state onto the transferred thin layer to form the structure, wherein the thickness of the transferred thin layer is about 100 Å to about 300 Å and the thickness of the additional second material deposited on the transferred thin layer about 1000 Å to about 5000 Å.

\* \* \* \* \*